United States Patent [19]

Itaya et al.

[11] Patent Number: 4,625,180

[45] Date of Patent: Nov. 25, 1986

[54] INTERMITTENTLY OPERATED FREQUENCY SYNTHESIZER HAVING SUPPRESSED FREQUENCY INSTABILITY

[75] Inventors: Eiji Itaya, Kamakura; Takeshi Takano, Ushikumachi; Takaharu Nakamura, Urawa, all of Japan

[73] Assignee: Fujitsu Limited, Kawasaki, Japan

[21] Appl. No.: 813,139

[22] Filed: Dec. 24, 1985

[30] Foreign Application Priority Data

Dec. 28, 1984 [JP] Japan .................................. 59-276319

[51] Int. Cl.⁴ ............................................. H03L 7/18
[52] U.S. Cl. ......................................... 331/2; 331/14; 331/25; 455/343
[58] Field of Search ...................... 331/1 A, 2, 14, 25; 455/343

[56] References Cited

U.S. PATENT DOCUMENTS 4,441,098  4/1984  Borras et al. .................... 340/365 R
4,521,918  6/1985  Challen .............................. 331/14 X

FOREIGN PATENT DOCUMENTS 1591621  2/1971  Fed. Rep. of Germany ........ 331/14

Primary Examiner—Siegfried H. Grimm
Attorney, Agent, or Firm—Staas & Halsey

[57] ABSTRACT

A frequency synthesizer having an intermittently operated PLL circuit in which power is intermittently applied to a prescaler to reduce power consumption. The PLL circuit is operated such that fluctuations in the frequency synthesizer output frequency do not occur. This stability in the output frequency results from selectively providing signals to the phase comparator within the PLL circuit only during a time period beginning after power is applied to the prescaler and ending before power is removed from the prescaler.

9 Claims, 12 Drawing Figures

INTERMITTENTLY OPERATED FREQUENCY SYNTHESIZER HAVING SUPPRESSED FREQUENCY INSTABILITY

BACKGROUND OF THE INVENTION

The present invention relates to a frequency synthesizer circuit used for mobile transmission systems, and more particularly to an improved frequency synthesizer which suppresses frequency instability due to intermittent operation of a phase-locked loop circuit.

A phase-locked loop (hereinafter "PLL") type frequency synthesizer is widely used as a stable frequency generator for providing various frequencies at predetermined frequency intervals. For example, PLLs are used as local oscillators in mobile communication systems. These systems require that the receiving frequency be shifted as the receiver is travelling so in order that an idle frequency channel alotted to the area can be found.

In such mobile systems, it is important to minimize power consumption. In frequency synthesizers, the PLL circuit consumes a large percentage of the frequency synthesizer power consumption. This is because the PLL circuit comprises bipolar transistor elements which consume a relatively high amount of power, especially at high frequencies. Other circuits in a mobile communication system can be constructed using field effect transistor elements which consume a relatively low amount of power. Therefore, in order to reduce power consumption in a mobile communication system, the PLL circuit is generally only operated intermittently. In a mobile communication system, the frequency synthesizer must to be very stable, because the frequency allocations for mobile communications systems are very close to each other. Therefore, a very small fluctuation in the frequency generated by a frequency synthesizer causes the system to malfunction.

In order to clarify the problem caused by frequency fluctuations in a PLL frequency synthesizer and to illustrate the advantages of the present invention, the structure and operation of a frequency synthesizer is briefly described.

Frequency synthesizers generally utilize a PLL to generate the required frequencies. PLL circuits normally include a voltage controlled oscillator (VCO), a reference oscillator, and a phase detector which compares the output of the VCO with a reference frequency. Normally, a prescaling frequency counter and one or more programmable or switchable frequency dividers are also included with the PLL so that the loop can be locked to various multiples of the reference frequency.

The prescaling counter (usually called a prescaler) counts down the frequency output by the VCO, which serves as the output frequency of the synthesizer and usually a very high frequency, to a lower frequency at which low speed integrated circuit devices are capable of operating.

If the frequency of the reference oscillator is $f_r$, the count down ratio of the prescaler and of the programmable frequency divider are 1/P and 1/N respectively, the output frequency $f_{out}$ becomes:

$$f_{out} = N \cdot P \cdot f_r$$

Accordingly, the output frequency is an integral multiple of the reference frequency $f_r$ which is stabilized via a crystal oscillator. It is therefore possible to provide a stable frequency signal at any one of a plurality of frequencies separated by the reference frequency $f_r$, without the need of a crystal oscillator for each frequency. The above described method is generally called a prescaling method. Modifications of the prescaling method are disclosed in, for example, Vadio Manassewitsch, "Frequency Synthesizers Theory and Design," John Wiley & Sons, Inc., 1976. One such modification is the pulse swallow method. Because such modifications are known to those skilled in the art, a detailed explanation of the modifications is omitted.

Basic frequency synthesizers are described in, for example: U.S. Pat. No. 4,521,918 issued on June 4, 1985 to R. F. Challen, which discloses a fundamental frequency synthesizer; and Japanese Laid Open Patents Provisional No. 58-159029 by Nishiki et al., No. 58-66422 by Ohba et al. and No. 58-66423 by Fujita et al. Each of these documents refers to minimizing power consumption of a PLL circuit by operating it intermittently. The PLL circuit is operated intermittently because a large amount of frequency synthesizer power is consumed by the bipolar devices included in the PLL circuit, especially in the prescaling circuit which operates at a very high frequency.

However, the inventors have determined that when a PLL circuit is operated intermittently there is a short period of time during which the output frequency of the frequency synthesizer is unstable. This period of time corresponds to the time for the frequency counter to start after the PLL circuit is switched. Because of this frequency instability, many mobile communication systems must include means to prevent malfunctions due to the frequency instability.

SUMMARY OF THE INVENTION

An object of the present invention is provide a frequency synthesizer wherein frequency instability due to intermittent operation of a PLL circuit is suppressed.

Another object of the present invention is to provide a frequency synthesizer for a mobile transmission system that avoids the problems caused by frequency synthesizer instability.

The inventors have analyzed why frequency synthesizer instability occurs, and based upon this analysis have determined that it occurs at each instant that the PLL circuit is switched on. This analysis showed that the frequency instability is related to the frequency ringing of the PLL circuit which they observed. This frequency ringing is caused by a variable phase relationship between the PLL switch ON time and the reference frequency. The analysis of this relationship is described below in detail.

Based upon the inventors' analysis of the cause of the frequency instability, the inventors decided to place switches at the two inputs of the phase comparator of the PLL circuit. These switches are switched simultaneously with power being applied to the prescaler of the PLL circuit; that is, the switches are switched ON after the power is applied to the prescaler, and are switched OFF before power is removed from the prescaler. As a result, the output of the phase comparator is in a high impedance state while the switches are turned off. Consequently, the voltage in the PLL loop filter remains constant as does the output of the VCO. When the switches are turned on, no frequency ringing occurs because the phase relationship between the switching time and the reference frequency is held constant.

The above and other objects of the present invention will become apparent from the following detailed description read in conjunction with the drawings and appended claims.

BRIEF DESCRIPTION OF THE DRAWINGS

The accompanying drawings illustrate embodiments of the present invention, and together with the description serve to explain the principles of the invention. In the drawings like reference numerals identify similar elements.

DETAILED DESCRIPTION OF THE PREFERRED EMBODIMENTS

Figure 1:
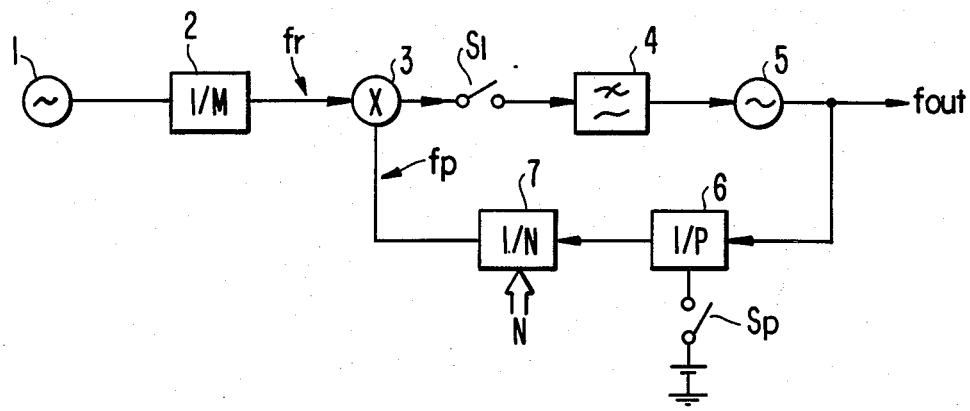
FIG. 1 is a block diagram of a prescaler frequency synthesizer circuit.

The inventors have determined that frequency instability in a frequency synthesizer occurs when a PLL circuit of the synthesizer is operated intermittently. FIG. 1 is a block diagram of a prescaler frequency synthesizer. In FIG. 1, crystal stabilized oscillator 1 has a frequency of, for example, 10 MHz. The output of the crystal stabilized oscillator 1 is applied to frequency divider 2 which counts down the frequency of the oscillator 1 by M to provide a reference frequency $f_r$ of, for example, 30 kHz. The reference frequency fr is applied to a phase-locked loop (PLL) which comprises a phase comparator 3, a low pass filter 4, a voltage controlled oscillator (VCO) 5, a prescaler 6 and a variable or switchable frequency divider 7. The output frequency of the PLL, $f_{out}$ can be, for example, 800 MHz, and corresponds to the output of VCO 5. The output of the VCO 5 is controlled by a signal provided by the low pass filter 4 which is called a loop filter. The output frequency $f_{out}$ is divided by prescaler 6 which has a count down ratio of 1/P where P can be, for example 128. As a result, when the output of the VCO 5 is 800 MHz, then the output of the prescaler 6 is approximately 6 MHz, which is a frequency capable of being processed by FET devices. The output of the prescaler 6 is applied to the programmable frequency divider 7 which has a variable count down ratio of 1/N. The output of freqency divider 7, $f_p$, is approximately equal to $f_r$.

The phase of $f_p$ is compared to the phase of $f_r$ by phase comparator 3 which generates a signal varying in accordance with the difference in the phase between these two signals. The output of the phase comparator 3 is applied to VCO 5 through the loop filter 4. As a result, the output frequency $f_{out}$ is stabilized at N·P·$f_r$. By varying the integer (N·P), it is possible to obtain a stabilized output frequency which is an integral multiple of the reference frequency $f_r$.

To minimize power consumption of the PLL circuit the circuit is operated intermittently via switches S1 and $S_p$ (FIG. 1). As shown in waveform A of FIG. 2, switches S1 and $S_p$ are switched simultaneously so that the PLL circuit operates intermittently. The switches S1 and $S_p$, as well as those described hereinafter comprise FET switches. Switch $S_p$ controls the power supply to the prescaler 6. When both switch S1 and $S_p$ are closed (i.e., ON) the output frequency $f_{out}$ is controlled to have a frequency corresponding N·P·$f_r$. When switches S1 and $S_p$ are open (i.e., OFF), the output frequency $f_r$ drifts slightly due to the gradual discharge of the loop filter 4. Because the output frequency drifts only a small amount, most frequency synthesizers used in mobile communications systems include such a power saving mechanism; and development efforts have concentrated on minimizing the power consumed by the PLL circuit.

Figure 2:
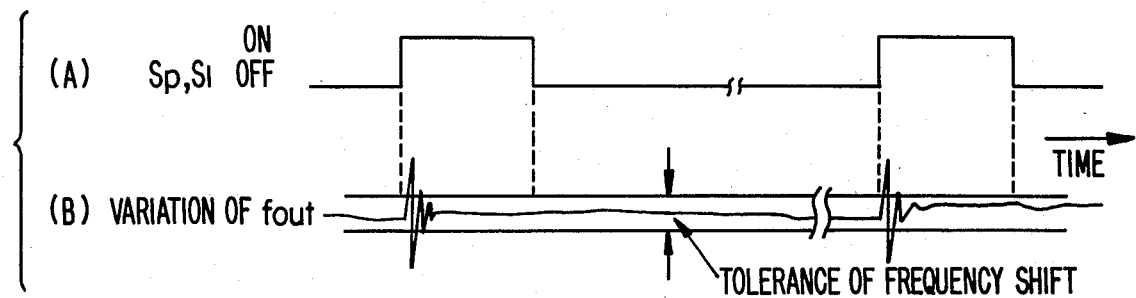
FIG. 2 is a timing diagram illustrating the relationship between the ON-OFF timing of the PLL circuit and the frequency synthesizer output frequency fluctuations.

As seen in waveform B of FIG. 2, the output frequency $f_{out}$ is unstable at each instant the PLL circuit is switched ON. The reason for this instability, as determined by the inventors, is as follows.

Figure 3:
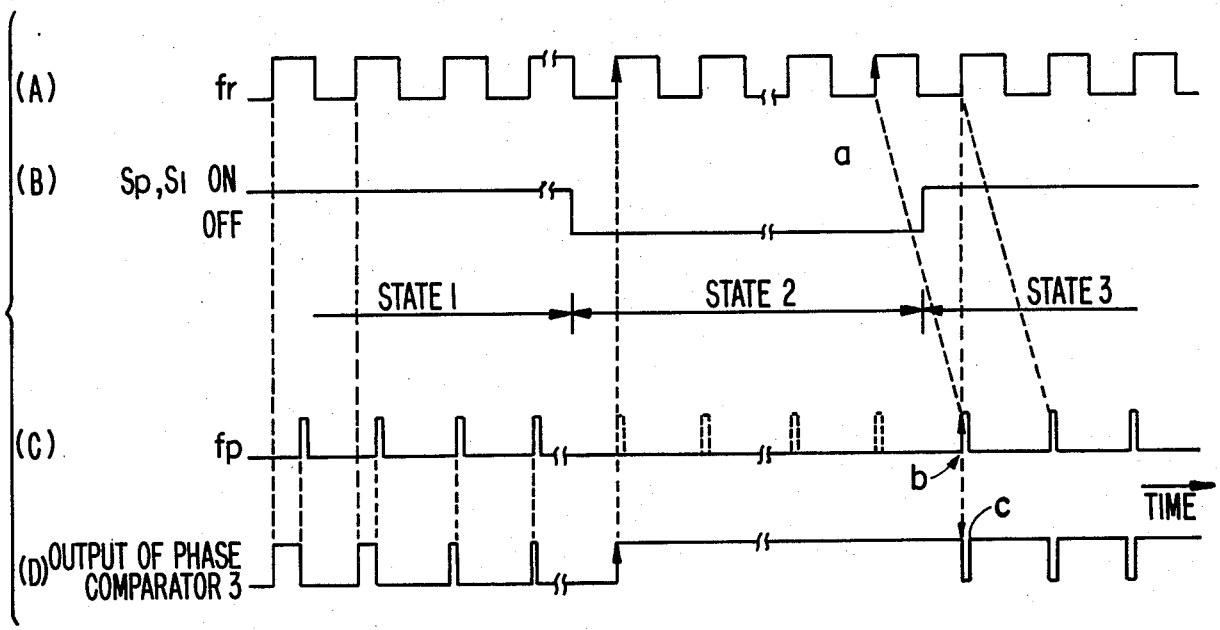
FIG. 3 is a timing diagram illustrating the phase relationship between the various circuit elements of a PLL circuit.

FIG. 3 is a timing diagram illustrating the phase relationship between various elements in the intermittently operated PLL circuit of FIG. 1. Specifically, waveforms A and C of FIG. 3 respectively illustrate the phase relationship between the reference frequency $f_r$ and the programmable frequency divider 7 output frequency, $f_p$. When the switches Sp and S1 are closed (i.e., ON) the output of the phase comparator 3 is as shown in waveform D of FIG. 3. This is identified as State 1 in FIG. 3.

During State 1 the phase shifter 3 outputs a signal corresponding to the phase difference between $f_r$ and $f_p$ as shown in waveform D of FIG. 3. This phase difference signal is applied to the VCO 5 via loop filter 4. Consequently, the output frequency $f_{out}$ is stabilized at a frequency corresponding to N·P·$f_r$. Waveform D of FIG. 3 shows that as the phase difference between the signal $f_r$ and $f_p$ decreases, the output of comparator 3 also decreases to zero.

In FIG. 3, State 2 corresponds to the time during which the switches Sp and S1 are turned OFF (i.e., open). Because switch Sp is open the signal fp is not applied to the phase comparator 3. The phase comparator 3, therefore, determines that the phase of $f_p$ is delayed by more than 2π radians, and produces a constant output as shown in waveform D. This output, however, is not applied to the loop filter 4 because Switch S1 is open. The VCO continues to provide $f_{out}$ at a frequency corresponding to that generated during State 1, because the output of the loop filter 4 is maintained in a capacitor of the filter (e.g., the capacitor of a simple low pass filter). The VCO 5 is therefore driven by the voltage stored in the capacitor (not shown) of the loop filter 4.

Normally the amount of drift that occurs in the output frequency during the time that the PLL circuit operates in State 2 is small. The time for which a frequency synthesizer is held in State 2 is in the range of, for example, one second, so as to avoid unacceptable drifting of the output frequency, $f_{out}$. The time subsequent to switches Sp and S1 being turned ON is labelled as State 3 in FIG. 3. In addition, FIG. 3 illustrates a PLL circuit condition such that no frequency drifting occurs during State 2. That is, FIG. 3 illustrates a situation wherein $f_p$ is maintained in phase with $f_r$, since $f_p$ matched $f_r$ at the end of State 1. Consequently, under these conditions, at the start of State 3 the output of the phase comparator 3 should be zero. However, because switching of the switches Sp and S1 is not synchronized to $f_r$, the switching of Sp and S1 may occur at any point between the points a and b designated on waveforms A and C of FIG. 3. In the situation illustrated by the waveforms of FIG. 3, the switches Sp and S1 are turned ON approximately midway during the period of the signal $f_r$, shown by waveform A of FIG. 3. This causes the phase comparator 3 to provide an output as illustrated in waveform D of FIG. 3. The VCO 5, therefore, follows this signal, and frequency ringing of the output signal $f_{out}$ results. As shown in FIG. 2, waveform B, the ringing is quickly damped due to the PLL circuit action.

As described above, the frequency ringing occurs each time the switches Sp and S1 are turned on. Those skilled in the art will recognize that the amplitude of the frequency fluctuation (i.e., ringing) depends upon the phase difference between $f_r$ and the time at which switch Sp is turned on. It will also be understood by those skilled in the art that the maximum amplitude corresponds to the maximum phase difference of $2\pi$. A mobile communication system malfunctions whenever the fluctuation in output frequency, $f_{out}$ exceeds the frequency shift tolerance illustrated in waveform B of FIG. 2.

Figure 4:
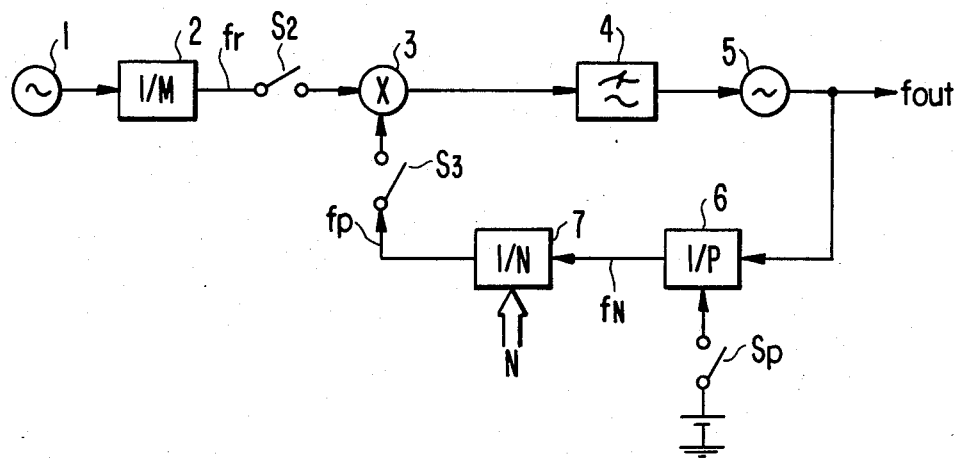
FIG. 4 is a block diagram of a first embodiment of a frequency synthesizer in accordance with the present invention.

The embodiments of the present invention suppress the above described frequency instability in a frequency synthesizer. FIG. 4 is a block diagram of a first embodiment of the present invention. Unlike the PLL circuit shown in FIG. 1, switch S1 has been eliminated from the PLL circuit of FIG. 4, and switches S2 and S3 have been added to switch the inputs to the phase comparator 3. Switches S2 and S3 respectively switch the reference frequency $f_r$ and the output of the programmable frequency divider 7, $f_p$. Both of these switches are turned ON and OFF while switch Sp is in the ON state.

Figure 5:
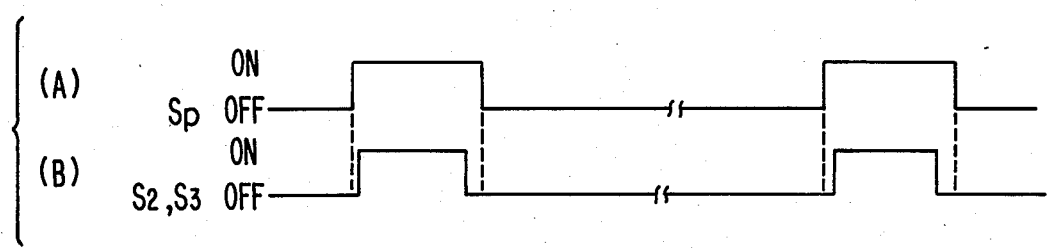
FIG. 5 is a timing diagram illustrating the ON-OFF timing of the switches shown in FIG. 4.

FIG. 5 is a timing diagram illustrating the timing of switches S2, S3 and Sp. Note that switches S2 and S3 are switched simultaneously and after Sp is turned ON, for example, after approximately 5 msec. In addition, switches S2 and S3 are turned OFF just prior to switch Sp being turned OFF, for example, approximately 5 ms before switch Sp is turned OFF.

Turning switches S2 and S3 OFF (i.e., opening the switches) removes the inputs from phase comparator 3. As a result the output voltage of the phase comparator 3 becomes zero, and simultaneously the output impedance of the phase comparator becomes very high. Because the output impedance of the phase comparator 3 is high and the output signal of the phase comparator 3 is zero, the output voltage of the loop filter 4 is retained in the capacitor (not shown) of the low pass filter. As described above with respect to FIG. 1, the VCO 5 therefore continues to provide the output frequency corresponding to that generated just prior to the opening of switches S2 and S3.

In the circuit of FIG. 4, when switches S2 and S3 are turned ON (i.e., closed) the difference in phase between $f_r$ and $f_p$ described with respect to FIG. 3 does not occur. This is because switches S2 and S3 are switched ON simultaneously just after switch Sp is turned on. More particularly, the output of the phase comparator 3 is typically zero at the end of State 1 as shown in FIG. 3, because the frequency of $f_p$ has been locked to the frequency of $f_r$. Therefore, if these frequencies are kept equal during the time when the PLL is switched OFF, the output of the phase comparator 3 will be zero when the switches S2 and S3 are turned on. Consequently, there is no instability in the frequency of the output signal $f_{out}$. If, however, there is some frequency variation between $f_p$ and $f_r$, then when the switches S2 and S3 are turned ON, the PLL circuit begins its normal operation to stabilize the frequency, but ringing of the type shown in FIG. 2 does not occur.

The frequency synthesizer shown in FIG. 4, therefore suppresses the frequency instability occurring in circuits such as shown in FIG. 1. The inventors' experiments have shown that a small amount of frequency instability still occurs in the circuit of FIG. 4. The magnitude of any frequency fluctuations is, however, very small compared to that of the fluctuations occurring in the circuit of FIG. 1. The inventors have analyzed the frequency instability in the FIG. 4 circuit and determined that it arises from the phase relationship between the time at which the switch Sp turns ON with respect to the phase of the signal $f_N$ applied to the 1/N variable frequency divider 7.

Figure 6:
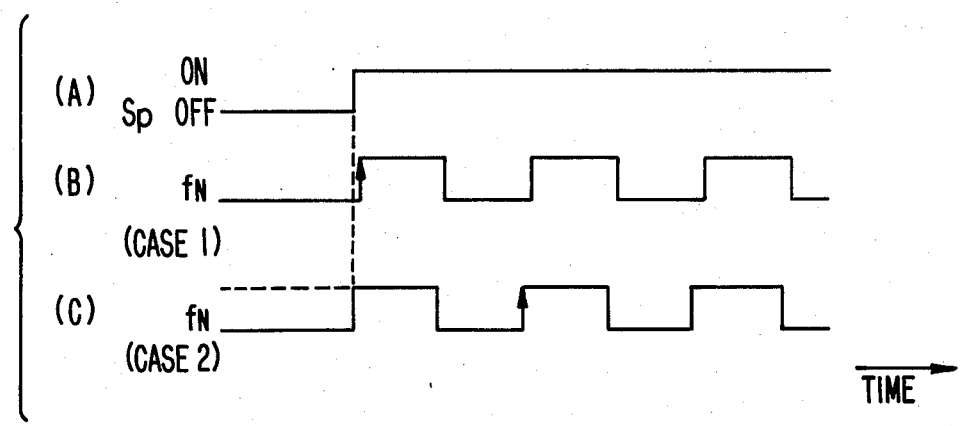
FIG. 6 is a timing diagram illustrating the start up timing of the 1/N programmable frequency divider shown in FIG. 4.

FIG. 6 is a timing diagram illustrating the timing for the start of the operation of the 1/N programmable frequency divider 7 shown in FIG. 4. Specifically, FIG. 6 illustrates the phase relationship between an input signal to the variable frequency divider 7, $f_N$ and the operation of switch $S_p$. Because the operation of the switch $S_p$ is not synchronized with the signal $f_N$, start up of the variable frequency divider 7 has no fixed relationship to the time at which the switch Sp turns ON. Referring to waveform B in FIG. 6, if the switch Sp turns ON just prior to the leading edge of the signal $f_N$, then there is practically no phase difference between the two signals. If, however, the switch Sp turns ON just after the leading edge of the signal $f_N$ as shown in waveform C of FIG. 6, then there is a maximum phase delay of 2 between the two signals. As those skilled in the art will recognize, the above relationships between the switching of the switch Sp and the signal $f_N$ holds regardless of whether or not the variable frequency divider 7 counts pulses ON the leading or trailing edge of a signal.

The phase difference between switching of the switch Sp and the signal $f_N$, therefore, occurs as long as the switching point of Sp is not synchronized with the signal $f_N$. Even though the phase difference is reduced by 1/N at the input of the phase comparator 3 due to the 1/N programmable frequency divider 7, this phase difference still causes frequency instability similar to that described with respect to FIGS. 2 and 3, although with a very small magnitude.

Figure 7:
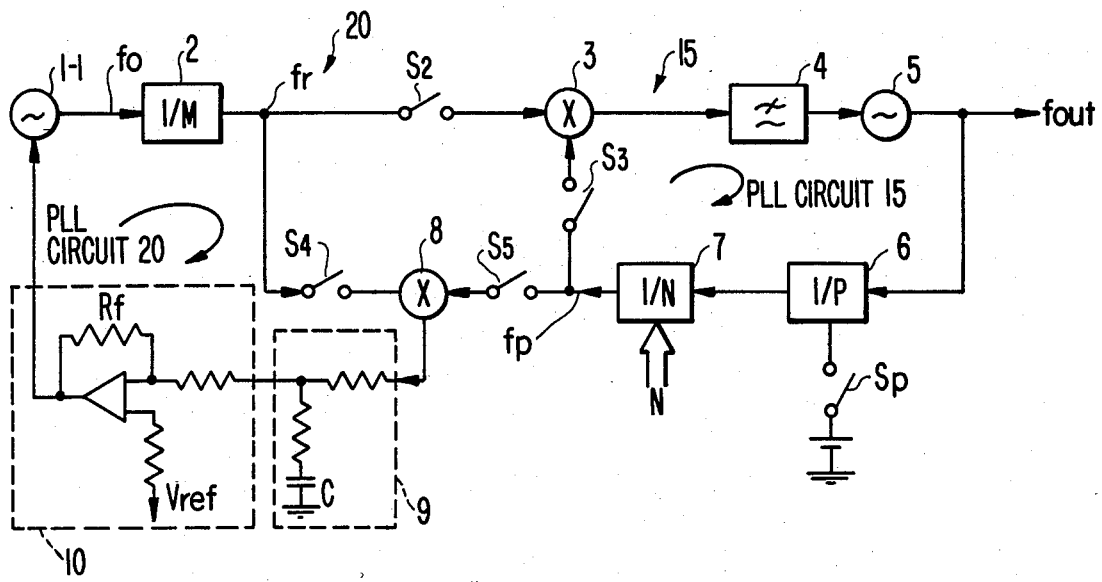
FIG. 7 is a block diagram of a second embodiment of the present invention.
Figure 9:
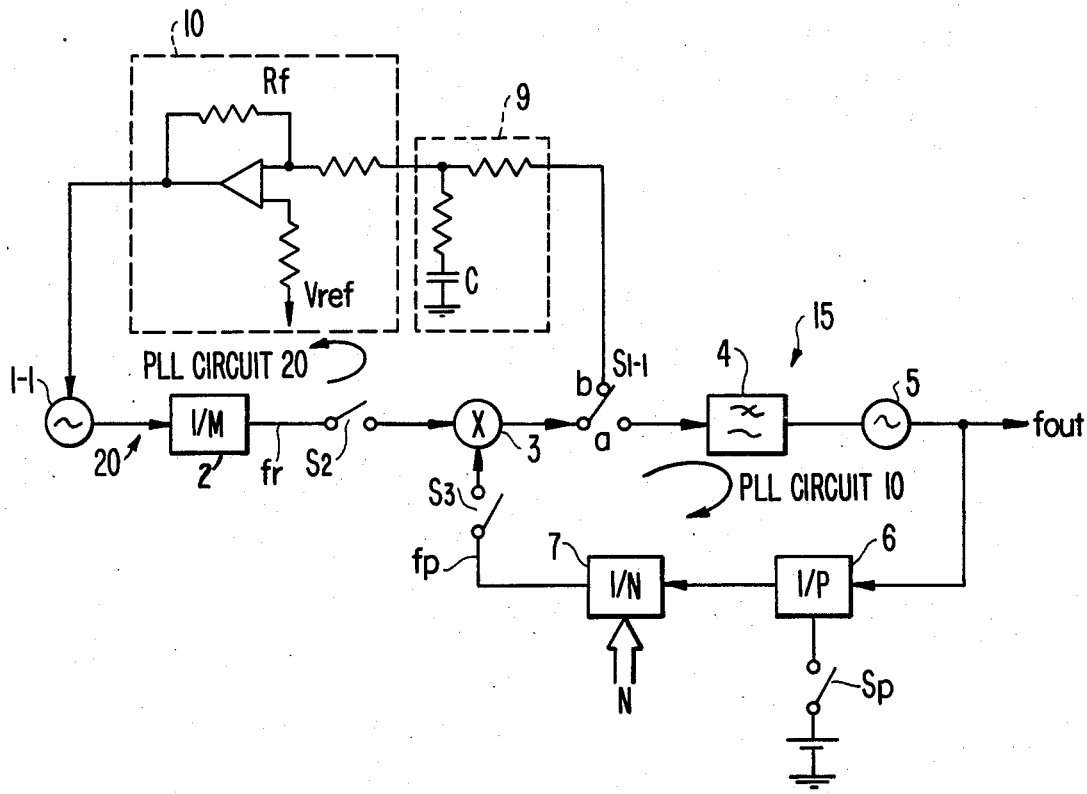
FIG. 9 is a block diagram of a third embodiment of the present invention.
Figure 11:
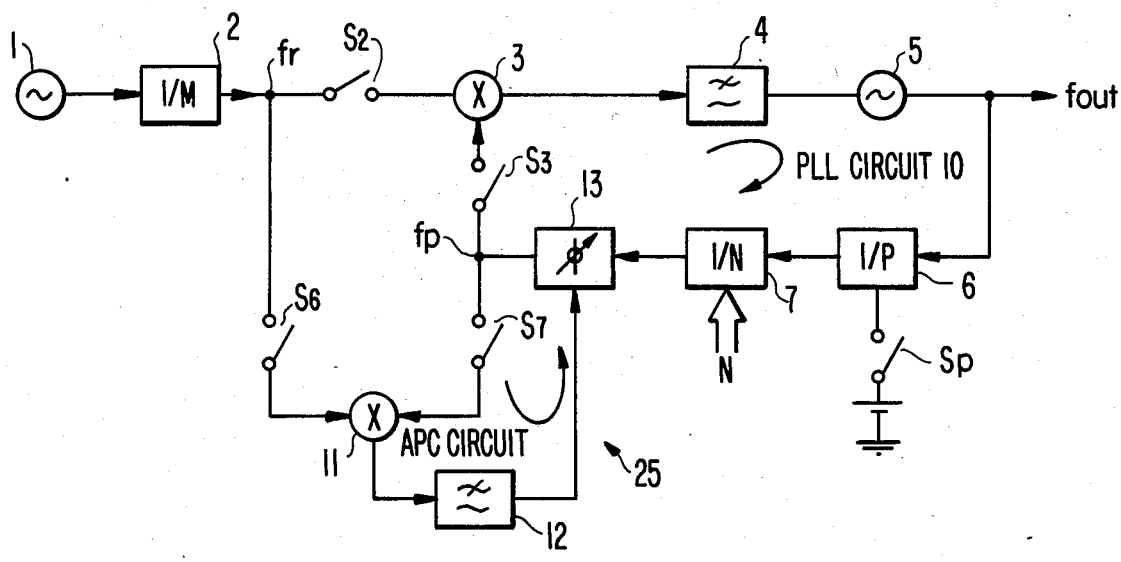
FIG. 11 is a block diagram of a fourth embodiment of the present invention.

The embodiments of the present invention illustrated in FIGS. 7, 9 and 11 suppress the minor frequency instability such as described with respect to FIGS. 4 and 6. FIG. 7 is a block diagram of a second embodiment of the frequency synthesizer of the present invention. The frequency synthesizer illustrated in FIG. 7 includes two PLL circuits 15 and 20. The first PLL circuit 15 corresponds to the PLL circuit shown in FIG. 4. The second PLL circuit 20 provides the reference frequency $f_r$ to the first PLL circuit 15. The second PLL circuit 20 comprises a voltage controlled crystal oscillator (VCXO) 1-1, a 1/M count down frequency divider 2, a third switch S4, a second phase comparator 8, a second loop filter 9 and a operational amplifier 10. The second PLL circuit 20 connects to the first PLL circuit 15 via switches S2 and S5. The second PLL circuit operates at a lower frequency than does the first PLL circuit 15. Therefore, the second PLL circuit 20 comprises FET devices and therefore has very low power consumption. The physical switching of the switches can be accomplished via conventional methods; therefore, the following primarily focuses upon the timing for switching the various switches in FIG. 7.

Figure 8:
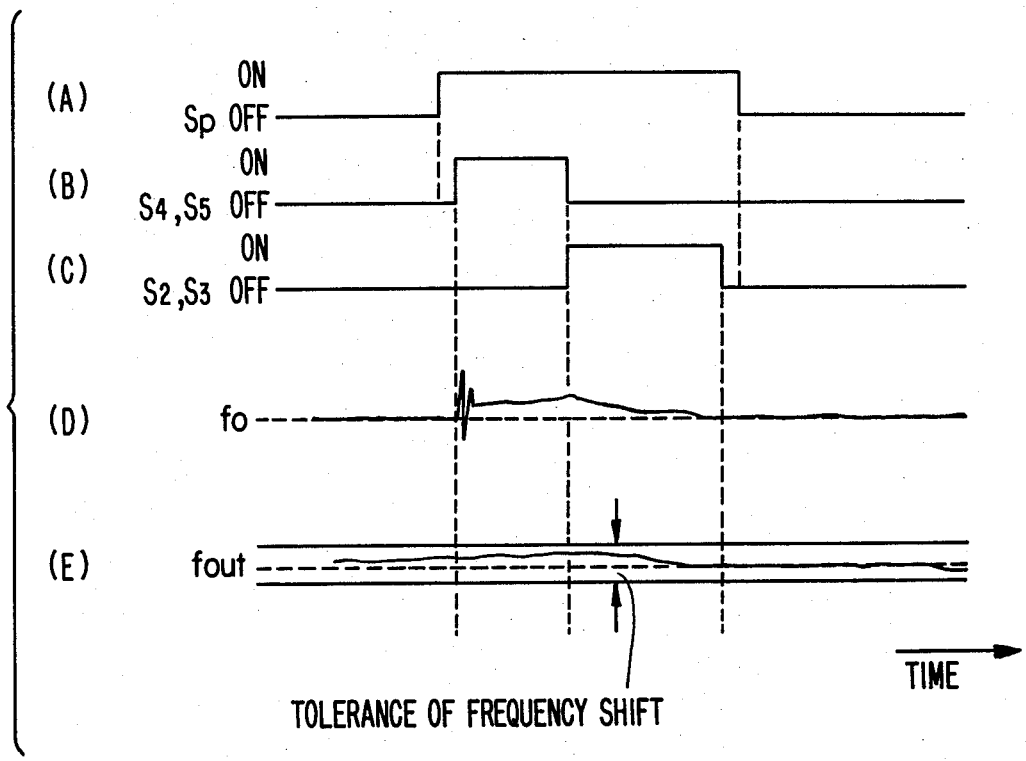
FIG. 8 is a timing diagram illustrating the ON-OFF timing of the circuit elements shown in FIG. 7, and the resulting fluctuation in the frequency synthesizer output frequency.

FIG. 8 illustrates a timing diagram for the switching of the switches in FIG. 7. As seen in waveform A of FIG. 8, switch Sp is turned ON first. After a slight delay, usually a few milliseconds, switches S4 and S5 are turned ON as shown in waveform B in FIG. 8. At this point in time, if the phase relationship between the output of the 1/N count down frequency divider 7, $f_p$, the reference frequency $f_r$ is not equal, then the second phase comparator 8 generates a voltage corresponding to the phase difference between these signals. The output of the phase comparator 8 is smoothed by the second loop filter 9; amplified by the operational amplifier 10; and fed back to the VCXO 1-1 to adjust the phase relationship between the signals $f_p$ and $f_r$.

Varying the frequencies of the signal $f_o$ provided by VCXO 1-1 in accordance with the output of the phase comparator 8 adjusts the phase relationship between the signal $f_r$ and $f_p$. This phase adjustment, however, causes frequency instability in the signal $f_o$ due to the variable phase relationship between the signal $f_r$ and $f_p$ resulting from the same mechanism as discussed with respect to FIGS. 1–3. The frequency instability for the signal $f_o$ is illustrated in waveform D of FIG. 8. In the embodiment shown in FIG. 7, however, both switches S2 and S5 are open (i.e., OFF) during the period of instability in the signal $f_o$. Consequently, the first PLL circuit 15 is not disturbed by the instabilities in the signal $f_o$.

It is desirable that the frequency fo be a fixed frequency, and therefore, any frequency shifts in this signal should be eliminated. The embodiment in FIG. 7, however, eases the restrictions on the frequency stability of the signal $f_o$. Specifically, during the phase adjustment between the signal $_r$ and $f_p$, the output frequency of the first PLL circuit, $f_{out}$ functions as the standard frequency for the circuit. As described above, the frequency of the signal $f_{out}$ is locked to a frequency corresponding to N·P·$f_r$. Consequently, during the time that switches S2 and S3 are OFF, VCO 5 provides a stable frequency signal, and therefore, as shown in waveforms D and E in FIG. 8, the signal $f_o$ is locked to the frequency of the signal $f_{out}$.

After the first PLL circuit matches the phase of $f_r$ with that of $f_p$ (which usually occurs after approximately 50 msec.), switches S4 and S5 are turned OFF (i.e., opened), and simultaneously switches S2 and S3 are turned ON. This switching operation is illustrated in waveforms B and C of FIG. 8. No frequency instability occurs when switches S2 and S3 are turned on, since both inputs to the phase comparator 3 are in phase.

When switches S4 and S5 are simultaneously turned OFF as shown in waveform B of FIG. 8, the output impedance of the second phase comparator 8 becomes high. As a result the voltage stored in capacitor C of loop filter 9 discharges slowly to ground or to the voltage source V (not shown), applied to the operational amplifier 10 through a feedback resistor Rf. In FIG. 7, Vref represents a reference voltage applied to the operational amplifier 10. As the voltage on the capacitor C decreases, the frequency of the signal $f_o$ gradually decreases. As shown in waveform E of FIG. 8, frequency variations in the output signal $f_{out}$ are minimized and maintained within a small frequency shift tolerance.

One example of timing for the waveform shown in FIG. 8 is as follows. The power switch Sp is turned ON for approximately 100 msec., and then turned OFF for approximately 1 sec. this reduces the power consumption of the first PLL circuit 15 to approximately 1/10 of that occurring during continuous operation of the PLL circuit 15. During the first portion of time that the switch Sp is turned ON (e.g., 50 msec.) the second PLL circuit 20 equalizes the phase relationship between the signals $f_r$ and $f_p$. During a second portion of the time that the switch Sp is turned ON (e.g., 50 msec.) the first PLL circuit equalizes the phase relationship between the signals $f_p$ and $f_r$. These time periods are not critical and are merely presented to illustrate an embodiment of the present invention. The time periods are applicable to the other embodiments of the present invention described herein.

Figure 10:
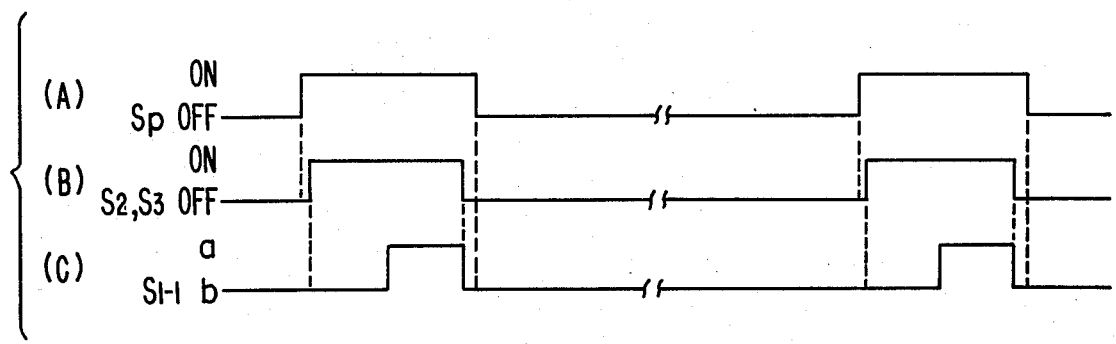
FIG. 10 is a timing diagram illustrating the ON-OFF timing of various elements shown in FIG. 9.

FIG. 9 is a block diagram of a third embodiment of the present invention. FIG. 10 is a timing diagram illustrating the timing of the switches shown in the FIG. 9 embodiment. The circuit shown in FIG. 9 comprises a first PLL circuit 15 and a second PLL circuit 20. The second PLL circuit comprises VXCO 1-1, 1/M frequency divider 2, switch S2, phase comparator 3 which is used commonly with the first PLL circuit 15, a circuit changing switch S 1-1, second loop filter 9 and operational amplifier 10.

Referring to waveform A in FIG. 10, the switch Sp is turned on. After a short delay, for example a few milliseconds, switches S2 and S3 are simultaneously turned on. As shown in waveform C of FIG. 10, the switch S1-1 is connected to contact b, which in turn is connected to second loop filter 9. With the circuit in this state, the signals $f_p$ and $f_r$ are brought into equal phase relationship by the second PLL circuit 20.

The switch S1-1 is then switched from contact b to contact a, which in turn is connected to loop filter 4. The output signal $f_{out}$ is therefore locked to the reference frequency $f_r$. When the phase locking operation is completed, switches S2 and S3 are simultaneously turned OFF, and switch S1-1 is connected to terminal b. Subsequently, switch Sp is turned OFF. Frequency fluctuations in the circuit of FIG. 9 do not occur because the phase relationships are always equalized in a manner similar to that described with respect to the FIG. 7 circuit.

Figure 12:
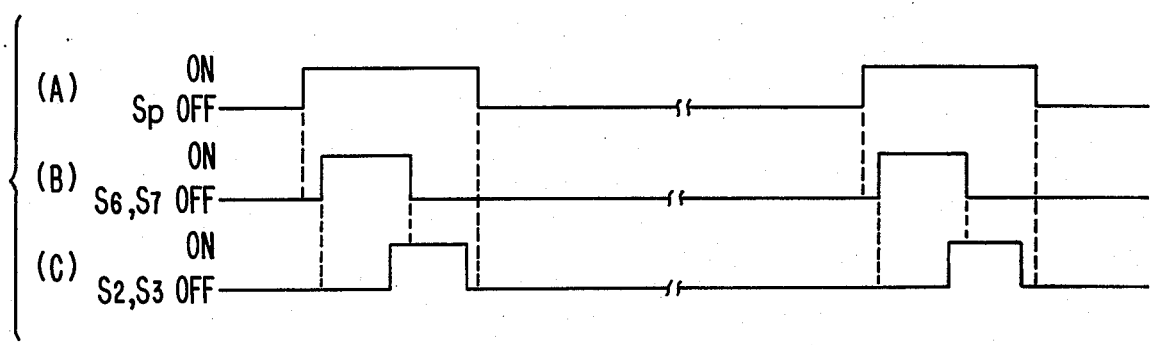
FIG. 12 is a timing diagram illustrating the ON-OFF timing of various elements of the FIG. 11 circuit.

FIG. 11 is a block diagram of a fourth embodiment of the frequency synthesizer of the present invention. FIG. 12 is a timing diagram illustrating the timing of the various switches in the FIG. 11 circuit. The circuit of FIG. 11 does not include a voltage controlled crystal oscillator as employed in the FIGS. 7 and 9 embodiments. Instead, an ordinary crystal oscillator 1 is used. The FIG. 11 embodiment does not employ a second PLL circuit, and instead employs an automatic phase control (APC) circuit comprising a third phase comparator 11, a low pass filter 12, a variable phase shifter 13 and switch S7. Signals $f_r$ and $f_p$ are applied to the inputs of the third phase comparator 11 via switches S6 and S7, respectively. The output of the phase comparator 11 is fed back to the variable phase shifter 13 via low pass filter 12 in order to control the phase shifter.

As shown in waveform A of FIG. 12, switch Sp is turned ON first. After a short delay, for example, a few milliseconds, switches S6 and S7 are turned ON (i.e., closed), to respectively apply the signals $f_r$ and $f_p$ to the phase comparator 11. The variable phase relationship between the signals $f_r$ and $f_p$ due to the unsynchronized turning ON of the programmable frequency divider 7 with respect to the signal $f_r$, is corrected by shifting the phase of the signal $f_p$. After the signals $f_r$ and $f_p$ are brought in phase, switches S2 and S3 are simultaneously turned on. This occurs while switches S6 and S7 are ON. The first PLL circuit therefore begins to lock the frequency of the signals $f_{out}$ in accordance with the signal $f_r$. The APC circuit 25 is then turned OFF by turning switches S6 and S7 OFF. After the frequency of the signal $f_{out}$ is stabilized in accordance with the reference signal $f_r$, switches S2 and S3 are turned OFF. Finally, switch Sp is turned OFF. In a manner similar to that of the previous embodiments, frequency instabililty is prevented because the signals $f_r$ and $f_p$ are in phase.

In the above disclosure, the circuit elements such as the crystal oscillator, count down frequency divider, phase comparator, loop filter, voltage controlled oscillator, phase shifter and switches are conventional circuit elements which are widely available, usually in ICs. For example, such circuits can be obtained from RCA Corporation. The detailed description of these individual circuit elements is therefore not provided, and instead, the above explanation describes the circuit elements as used by those skilled in the art.

Previous to the present invention, frequency synthesizers utilizing prescaling could not be successfully used in a mobile communications systems because of the inherent frequency instability resulting from operating the phase locked loop intermittently in order to save power. The present invention, however, enables prescaler phase locked loops to be employed in mobile communications systems, because the present invention suppresses the frequency instability. For example, if the circuit shown in FIG. 1 was operated in the 800 MHz band, the frequency instability shown in FIG. 2 occurred, resulting in frequency variations in the order of a few tens of MHz. In contrast, in the circuit of FIG. 4 operating in the same frequency band, the maximum frequency variation is decreased to a few hundred KHz. The frequency instability is even further suppressed to less than two KHz when utilizing the circuits of FIGS. 7, 9 and 11. The present invention not only suppresses frequency instability, but enables power consumption to be reduced to approximately 1/10 that of a continuously operated circuit.

The present invention, therefore, makes it possible to successfully operate a frequency synthesizer intermittently in mobile communication systems. The present invention, however, is not limited to mobile systems, and can be applied to any field where low power comsumption and narrow frequency allotments occur.

What is claimed is:

1. A frequency synthesizer having a phase locked loop (PLL) which is operated intermittently, comprising:
   first generating means for generating a reference frequency;
   a first phase locked loop circuit including
      first oscillator means for providing an output frequency in accordance with a first control signal;
      first frequency divider means for dividing the output frequency by a first integer and providing a comparison frequency;
      first phase comparator means for comparing a phase relationship between the reference frequency and the comparison frequency and for providing a first difference signal varying in accordance with the phase relationship between the reference frequency and the comparison frequency; and
      first loop filter means for filtering the first difference signal and for providing the first control signal to said first oscillator means;
   first switch means for intermittently applying a supply voltage to said first frequency divider means such that said first frequency divider means operates intermittently;
   phase correction switching means, operatively connected between said first phase comparator means and both of said first generating means and said first frequency divider means, for selectively providing the reference frequency and the comparison frequency to said first phase comparator means such that the phase relationship between the reference frequency and the comparison frequency is controlled so that the reference frequency and the comparison frequency are in phase during a time when said first switch means applies the power supply voltage to said first frequency divider means.

2. A frequency synthesizer according to claim 1, wherein said phase correction switching means comprises:
   second switch means for selectively providing the reference frequency to said first phase comparator means; and
   third switch means for selectively providing the comparison frequency to said first phase comparator means, wherein said second switch means and said third switch means operate simultaneously such that the reference frequency and the comparison frequency are simultaneously applied to said first phase comparator means after said first switch means applies the supply voltage to said first frequency divider means, and are simultaneously removed from said first phase comparator means before said first switch means removes the supply voltage from said first frequency divider means.

3. A frequency synthesizer according to claim 1, wherein said first generating means comprises:
   crystal controlled oscillator means for providing an integer multiple of the reference frequency as an output; and
   second frequency divider means for dividing the output of said crystal controlled oscillator means by the integer multiple of the reference frequency.

4. A frequency synthesizer according to claim 1, wherein said first frequency divider means comprises:
   first prescaler means for providing a signal corresponding to the output frequency divided by an integer P, and for receiving the supply voltage such that said first prescaler means is switched ON and OFF in accordance with said first switch means switching the supply voltage, and first programmable frequency divider means for dividing the output of said first prescaler means by a variable integer N.

5. A frequency synthesizer according to claim 2, wherein said first generating means comprises:
a second phase locked loop circuit including
voltage controlled oscillator means for generating the reference frequency in accordance with a second control signal;
second phase comparator means for comparing a phase relationship between the reference frequency and the comparison frequency and for providing a second phase difference signal varying in accordance with the phase relationship between the reference frequency and the comparison frequency;
second loop filter means for filtering the second difference signal and for providing the filtered second difference signal as an output signal;
amplifier means for amplifying the output signal of said second loop filter means and for providing this amplified signal to said voltage controlled oscillator means as the second control signal;
fourth switch means for selectively providing the reference frequency to said second phase comparator means; and
fifth switch means for selectively providing the comparison frequency to said second phase comparator means, wherein said fourth switch means and said fifth switch means operate simultaneously such that the reference frequency and the comparison frequency are simultaneously applied to said second phase comparator means after said first switch means supplies the supply voltage to said first frequency divider means, and are simultaneously removed from said second phase comparator means before said first switch means removes the supply voltage from said first frequency divider means.

6. A frequency synthesizer according to claim 5, wherein said voltage controlled oscillator means comprises:
voltage controlled crystal oscillator means for providing an integer multiple of the reference frequency; and
second frequency divider means for dividing the output of said voltage controlled crystal oscillator means by the integer multiple of the reference frequency.

7. A frequency synthesizer according to claim 2, wherein said first generating means comprises:
a second phase locked loop circuit including
voltage controlled oscillator means for providing the reference frequency in accordance with a second control signal
second loop filter means for filtering the first difference signal provided by the said first phase comparator means and for providing the filtered first difference signal as an output signal;
operational amplifier means for amplifying the output signal of said second loop filter means and for providing this amplified signal to said voltage controlled oscillator means as the second control signal;

circuit switch means for selectively providing the first difference signal to said first and second loop filter means such that the first difference signal is provided to said second loop filter means for a first portion of the time period during which said second and third switch means are respectively applying the reference frequency and the comparison frequency to said first phase comparator means, and the first difference signal is applied to said first loop filter means for a second portion of the time period during which said second and third switch means are applying the reference frequency and the comparison frequency to said first phase comparator means.

8. A frequency synthesizer according to claim 7, wherein said voltage controlled oscillator means comprises:
voltage controlled crystal oscillator means for providing an integer multiple of the reference frequency as an output; and
second frequency divider means for dividing the output of said voltage controlled crystal oscillator means by the integer multiple of the reference frequency.

9. A frequency synthesizer according to claim 2, further comprising:
variable phase shifter means operatively connected between said third switch means and said first frequency divider means, for varying the phase of the comparison frequency in accordance with a second control signal and for providing the phase varied comparison frequency to said third switch means;
second phase comparator means for comparing a phase relationship between the reference frequency and the phase varied comparison frequency and for providing a second difference signal corresponding to the phase relationship between the reference frequency and the phase varied comparison frequency;
second loop filter means for filtering the second difference signal and for providing the second control signal to said variable phase shifter means;
fourth switch means for selectively providing the reference frequency to said second phase comparator means; and
fifth switch means for selectively providing the phase varied comparison frequency to said second phase comparator means, wherein said fourth and fifth switch means operate simultaneously such that the reference frequency and the phase varied comparison frequency are respectively applied to the second phase comparator means while said first switch means applies the supply voltage to said first frequency divider means, and said second and third switch means simultaneously apply the reference frequency and the phase varied comparison frequency to said first phase comparator means after said fourth and fifth switch means apply the reference frequency and the phase varied comparison frequency to said second phase comparator means, and said second and third switch means simultaneously remove these signals from said first phase comparator means after these signals are removed from the second phase comparator means.

* * * * *